(12) United States Patent
Gokcebay

(10) Patent No.: US 10,135,268 B1
(45) Date of Patent: Nov. 20, 2018

(54) LOCKERS WITH CHARGING POWER

(71) Applicant: Digilock Asia Ltd., Kowloon (HK)

(72) Inventor: Asil T. Gokcebay, Petaluma, CA (US)

(73) Assignee: Digilock Asia Ltd., Kowloon (HK)

( * ) Notice: Subject to any disclaimer, the term of this patent is extended or adjusted under 35 U.S.C. 154(b) by 0 days.

(21) Appl. No.: 15/071,129

(22) Filed: Mar. 15, 2016

(51) Int. Cl.
  *H02J 7/00* (2006.01)
  *H04M 1/04* (2006.01)
  *H05K 7/14* (2006.01)
  *H04B 1/3883* (2015.01)
  *A47B 81/00* (2006.01)
  *A47B 97/00* (2006.01)

(52) U.S. Cl.
  CPC .............. *H02J 7/0027* (2013.01); *H04M 1/04* (2013.01); *H05K 7/1449* (2013.01); *A47B 81/00* (2013.01); *A47B 97/00* (2013.01); *H02J 7/00* (2013.01); *H04B 1/3883* (2013.01)

(58) Field of Classification Search
  CPC ...... A47B 81/00; A47B 97/00; H04B 1/3883; H04M 1/04; H02J 7/00; H02J 7/0027; H05K 7/1449
  USPC ...................... 174/72 A, 70 R, 135; 361/826
  See application file for complete search history.

(56) References Cited

U.S. PATENT DOCUMENTS

| | | | |
|---|---|---|---|
| 7,189,107 B1* | 3/2007 | Strayer | H01R 13/72 439/501 |
| 7,800,914 B2* | 9/2010 | Dully | G06F 1/1632 361/756 |
| 8,456,819 B1* | 6/2013 | Smith | A47B 96/00 312/223.1 |
| 9,368,924 B2* | 6/2016 | Byrne | H01R 13/73 |
| 2009/0267564 A1* | 10/2009 | Gerber | H02J 7/0027 320/114 |
| 2010/0176762 A1* | 7/2010 | Daymude | H02J 7/0044 320/115 |
| 2012/0078413 A1* | 3/2012 | Baker, Jr. | G07F 17/12 700/232 |
| 2014/0175031 A1* | 6/2014 | Roberts | H02J 7/0027 211/26.2 |
| 2015/0084590 A1* | 3/2015 | Pearlman | H02J 7/0027 320/111 |
| 2016/0165443 A1* | 6/2016 | Baldasare | H04W 12/06 455/411 |

* cited by examiner

*Primary Examiner* — Dimary Lopez Cruz
(74) *Attorney, Agent, or Firm* — Thomas M. Freiburger

(57) ABSTRACT

In a stack or matrix of lockers, typically in two, three or more tiers or rows and in multiple columns, charge power strips are secured at the back sides of the lockers and exposed through openings in the back walls of the lockers so as to provide line power and also low-voltage DC charging power for smartphones and other portable devices, with a plurality of different charge port fittings provided. The power strips are of a length to extend to two or more lockers and preferably are installed vertically, but could be installed horizontally. The lockers have a protected channel at rear, within which the power strip is installed.

6 Claims, 5 Drawing Sheets

LOCKERS WITH CHARGING POWER

BACKGROUND OF THE INVENTION

This invention concerns lockers for storage of users' articles, either long term or short term, and particularly the invention concerns an efficient system providing charging power terminals inside lockers so that computers or small hand-held devices such as smartphones can be charged during use of the locker.

Charging lockers, particularly those for charging mobile phones, have been available at public places such as airports, university campuses and stadiums, and have included cables with end connectors configured for several different charging port protocols. The charging devices have been wired for each locker component and are generally provided for either low voltage charging or line voltage charging or both. In the case of low voltage charging, such as with USB terminals or other terminals with cables for charging mobile phones, the chargers include a power supply with multiple outlets which are wired to each compartment. Since only a few types of cable terminals cover a multitude of cell phones in the market, several different charging cables in the charging locker can handle most phones. This provides great convenience to users of the lockers, who do not always carry their phone chargers with them. In the case where a line voltage is required, particularly with laptop computers that have many different charging port configurations, the line voltage has to be wired with conduits to prevent electrical shock and fire.

Prior to the current invention, there has not been a portable device charging system efficiently built into lockers, particularly a bank of lockers extending in a vertical stack or horizontally or both, in rows or columns.

SUMMARY OF THE INVENTION

The invention provides an efficient system for battery charging to serve laptop computers and smartphones or other hand-held devices in a variety of charging port configurations.

In a stack or matrix of lockers, typically in two, three or more tiers or rows and in multiple columns, charge power strips are secured at the back sides of the lockers and exposed through openings in the back walls of the lockers so as to provide line power and also low-voltage DC charging power for smartphones and other portable devices, with a plurality of different charge port fittings provided. The power strips are of a length to extend to two or more lockers and preferably are installed vertically, but could be installed horizontally. The lockers have a protective channel at rear, within which the power strip is installed.

In a preferred embodiment, a vertical column of lockers, in two, three or more tiers, have the protective channel at left or right of the rear wall of the lockers, with one side of the channel appearing as an extension of the side wall of the column of lockers; the protective channel can actually be integral with the side wall of a column of lockers, formed into an enveloping shape at rear of the locker. Threaded holes are included in the charging power strip to receive machine screws that are inserted through holes in the rear wall of the lockers, securing the charging power strip against the back of the locker structure.

In one preferred embodiment line power is received into the charging power strip at one end, and at the other end is a connection (e.g. a socket) to extend power to another charging power strip in an adjacent line of lockers. Each charging power strip has an internal transformer or power supply to provide the low-voltage power.

It is thus among the objects of the invention to provide for charging of laptop computers, smartphones or other small portable devices by a convenient modular power strip arrangement whereby a person using a locker can connect charging power to a charging port of one or more devices to charge the device during the period of locker use. These and other objects, advantages and features of the invention will be apparent from the following description of a preferred embodiment, considered along with the accompanying drawings.

DESCRIPTION OF PREFERRED EMBODIMENTS

Figure 1:
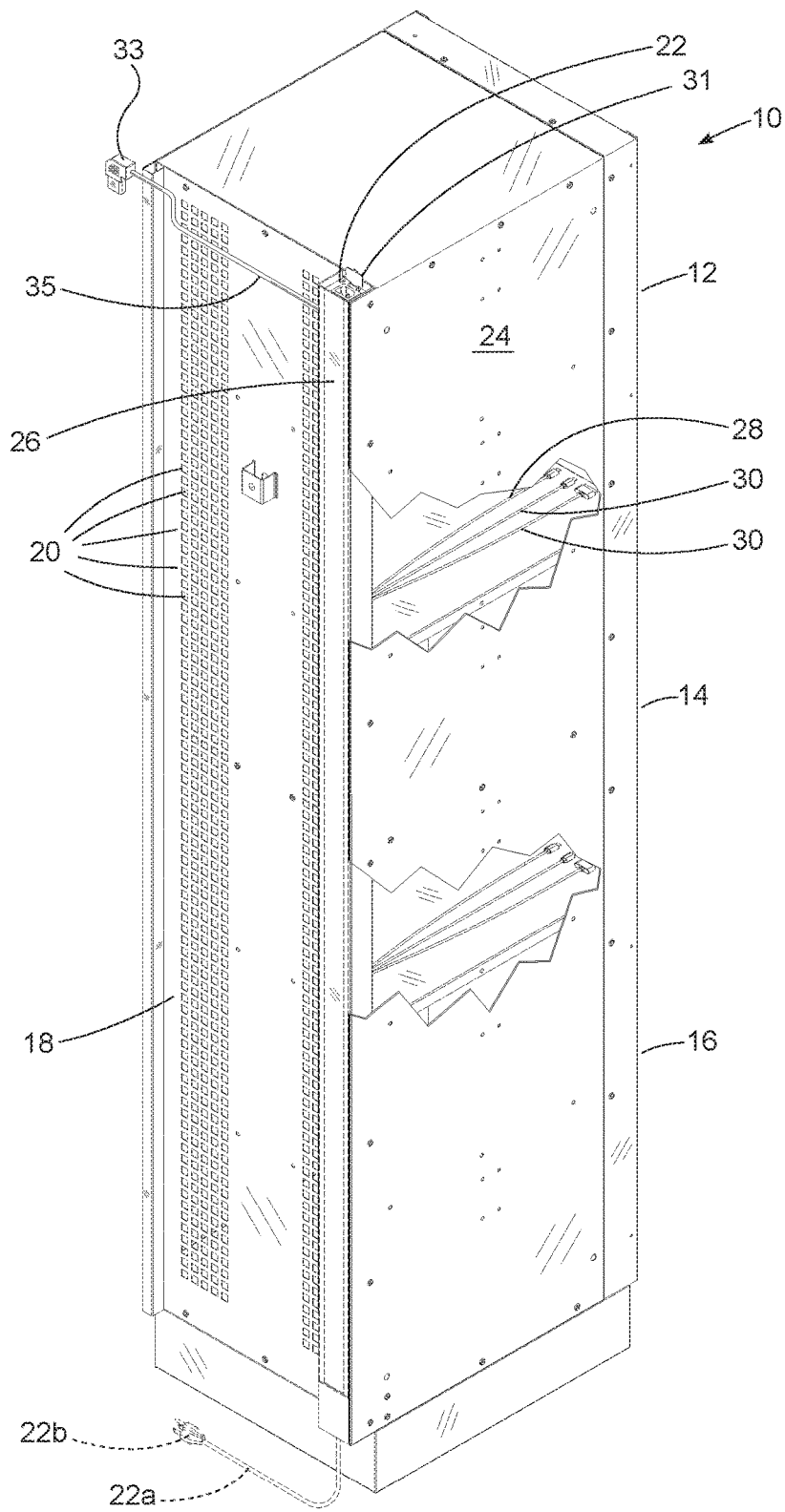
FIG. 1 is a perspective view showing a locker unit comprising three stacked lockers, shown from the rear left side and indicating the power stripped charging system of the invention.

In FIG. 1 a locker unit 10 is shown, revealing rear and left sides, the unit 10 having three vertically stacked lockers 12, 14 and 16 stacked in a single unit. At the back side 18 of the locker unit are inner vent holes 20, typically provided for such lockers. Also shown is a charging strip or power strip 22 of the invention, oriented vertically and positioned against the back side 18 of the locker unit, adjacent to the left side 24. The power strip is encased within a protective channel 26 that is formed or assembled to the locker unit. The cut away areas of FIG. 1 show three charging cables 28, 30 and 32 that extend into each of the lockers 12, 14 and 16 from the charging strip 22.

At top of the power strip 22 is a hinged cap 31 that seals closed a line-voltage socket (shown in FIG. 4 at 80) at the upper end of the power strip when the cap is lowered. The cap preferably is spring-biased toward closure. The socket can receive a plug 33 of a cord 35 from a power strip of an adjacent locker unit placed against the side wall 24. If the locker unit. 10 is a first tier of lockers of a series of similar tiers, the power strip 22 will include a line power plug-in cable 22a with a plug 22b, shown in dashed lines, as a source of line power for a series of locker units, without any cord 35 and plug 33 at the upper end.

Figure 2:
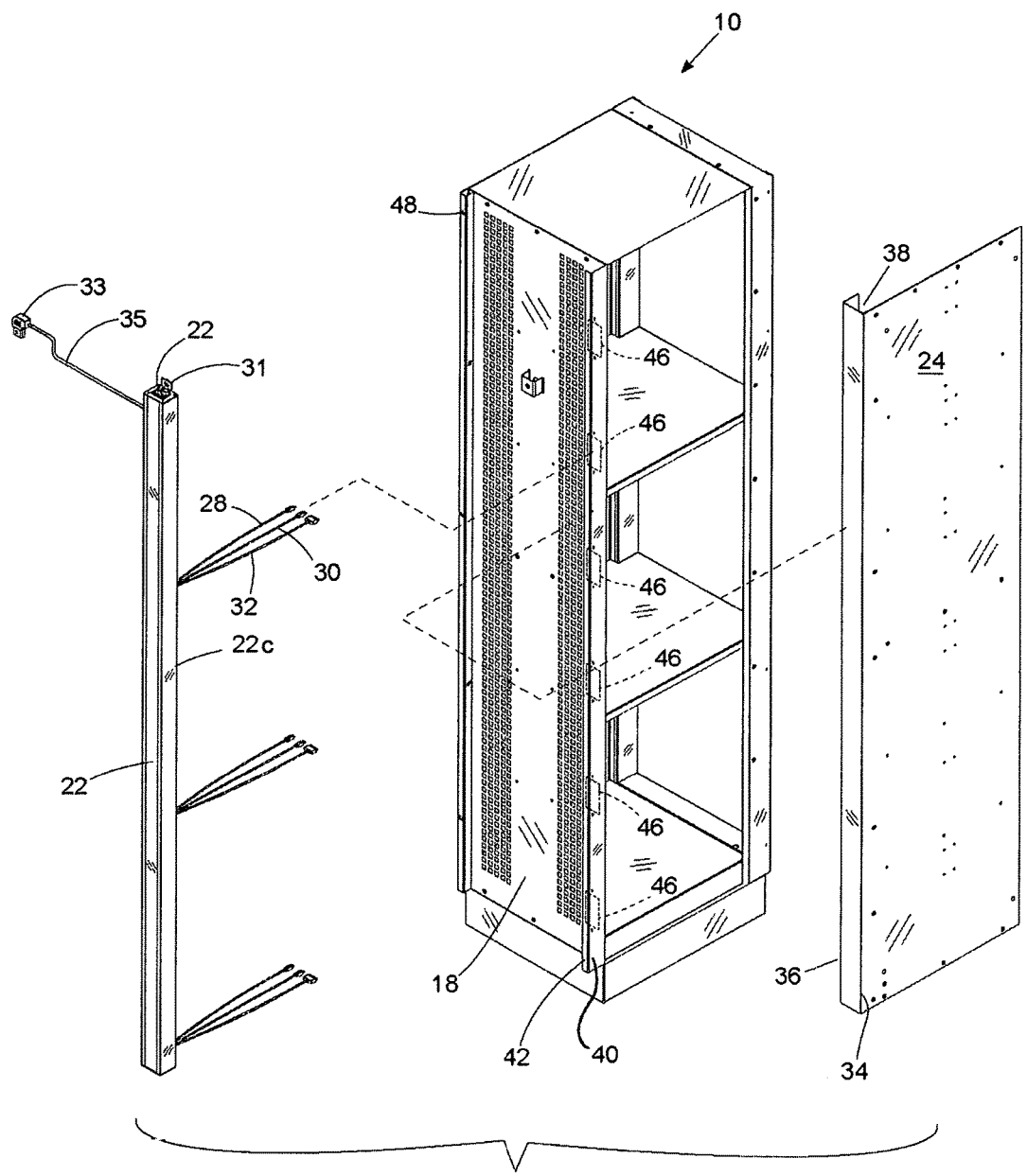
FIG. 2 is a perspective view similar to FIG. 1 but exploded so as to show components of the locker unit and charging system.

FIG. 2 shows, in exploded format, the charging strip 22 removed from the protective channel 26, indicating it is to be assembled against the back side 18 of the three-tiered locker unit 10 and showing the charging strip can comprise an elongated rectangular housing structure 22c that contains an electric cord 35. The drawing also shows, exploded from the locker unit, the left side wall 24, which in the illustrated embodiment is formed at two corners 34 and 36 into a channel 38. The corners 34 and 36 are right-angle bends in the sheet metal that, when the side is attached onto the body of the lock unit 10, forms the protective channel 26. In the implementation shown in FIG. 2, the locker body 10 has, optionally as a part of the back side 18, a flange 40 parallel to the locker's side 24, with a lip 42 as indicated. The channel 38 formed at the back of the locker unit's side 24 nests with this structure 40, 42 and provides for securement of the side 24 onto the remainder of the locker unit 10. Note that the channel 38 will have a slot or similar provision for the electric cord 35 to extend out of the channel at a position below the top of the power strip.

FIG. 2 also indicates openings 46 through the locker's back side, which could be formed as removable knockouts. These openings, preferably rectangular, align with the positions of the charging cables 28, 30, 32 at the spaced apart locations along the height of the charging strip 22. Additional openings or knockouts 46 are shown at an upper level at each locker opening lock unit 10, in the event the charging cables are to be positioned at the higher level.

FIG. 2 also shows that the locker unit 10, at the rear right of the unit, preferably has a flange or rolled-over wall structure 48 extending down the height of the unit, and preferably of the same depth as the rear-extending structure 24, 34, 40, 42 at the rear left, serving as stops for positioning the rear of the locker unit 10 against a wall.

Figure 3:
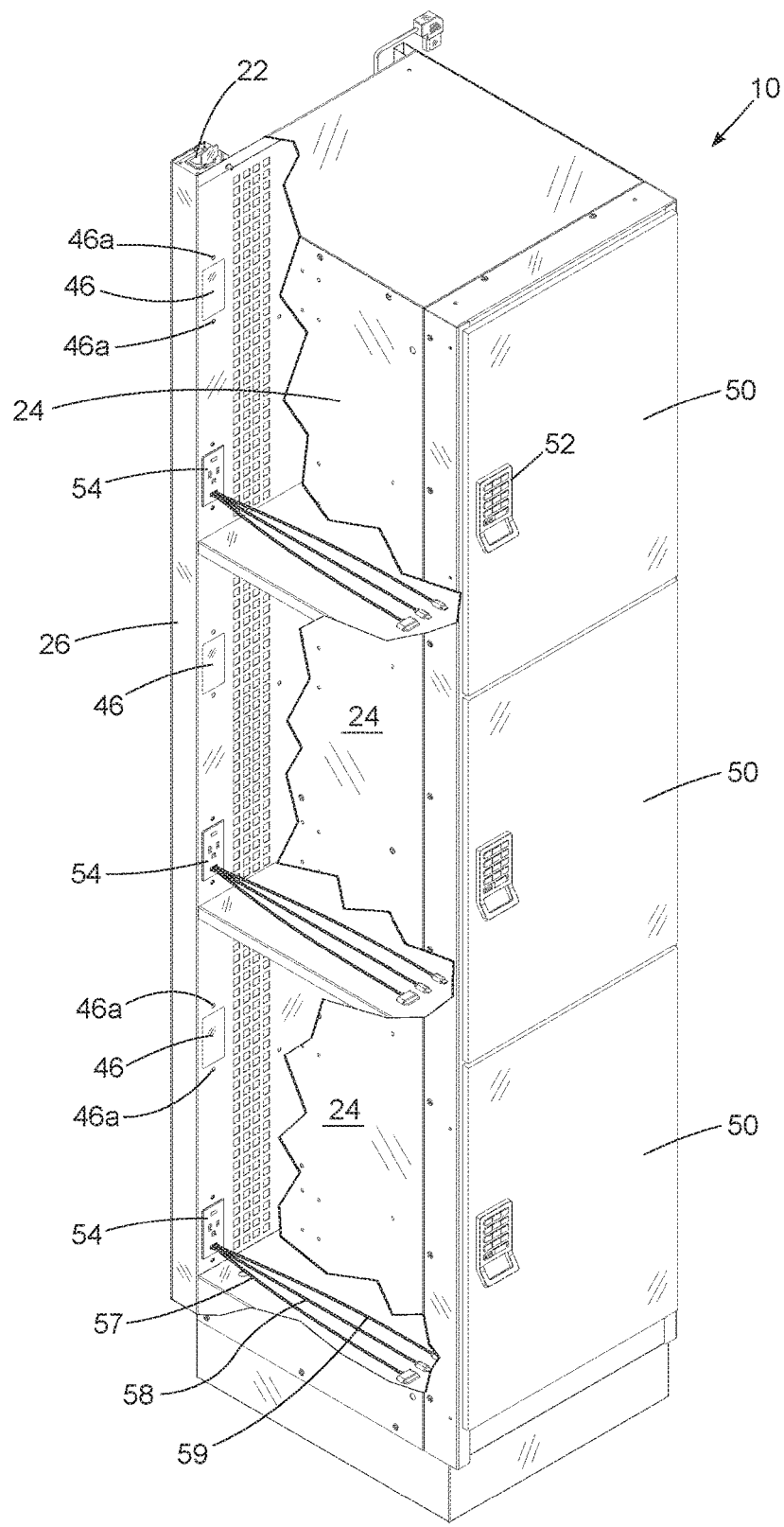
FIG. 3 is a perspective view from front left, partially cut away so as to show the charging features included in the locker unit.
Figure 4:
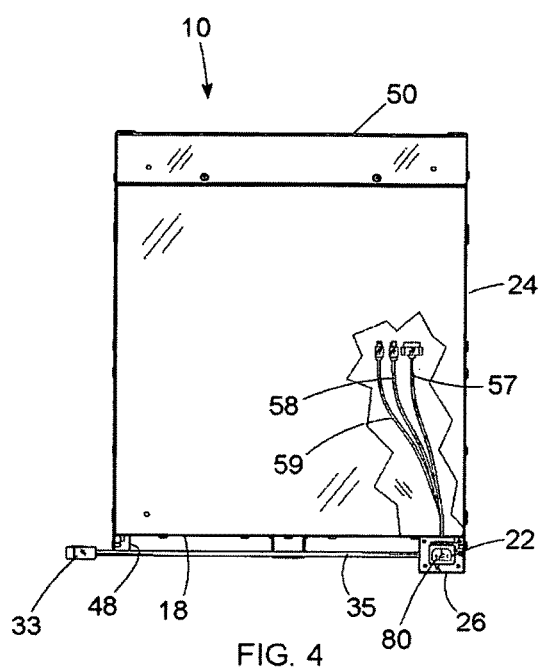
FIG. 4 is a partially broken away top view.
Figure 5:
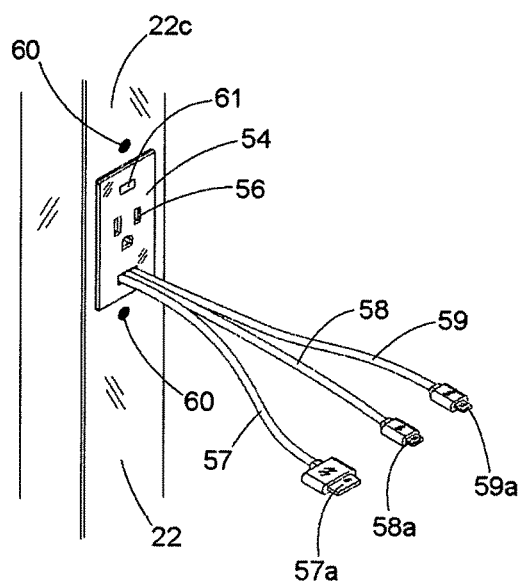
FIG. 5 is a frontal perspective view showing a portion of a modular power strip of the invention, prior to installation in a locker unit.

FIG. 3 shows the three-tier locker unit 10 in left-front perspective, showing locker doors 50 with electronic locks 52. The left side 24 of the unit is shown secured in place but cut away in portions at the level of each locker to reveal the power strip 22 as exposed at the inside rear of the locker. A terminal 54 is exposed at the interior of each locker as shown in the drawing. As also shown in FIG. 5, the terminal 54 includes a line voltage outlet 56 and a series of charging cables 57, 58 and 59. These cables carry low voltage (generally about five volts DC), and each has a different terminal charging connector 57a, 58a and 59a, to serve nearly all cell phones and other hand-held mobile devices. The line voltage outlet 56 can receive the plug of a charging unit for a laptop computer, for example. The terminal 54 preferably is relieved outwardly about 1/16" to 1/8" from the front surface 22c of the charging strip 22, so as to extend partially or fully through an appropriately positioned opening 46 in the back wall of the locker unit 10. See FIGS. 3 through 6 showing the charging strip, the terminals and their relationship to the locker unit and individual lockers.

Figure 6:
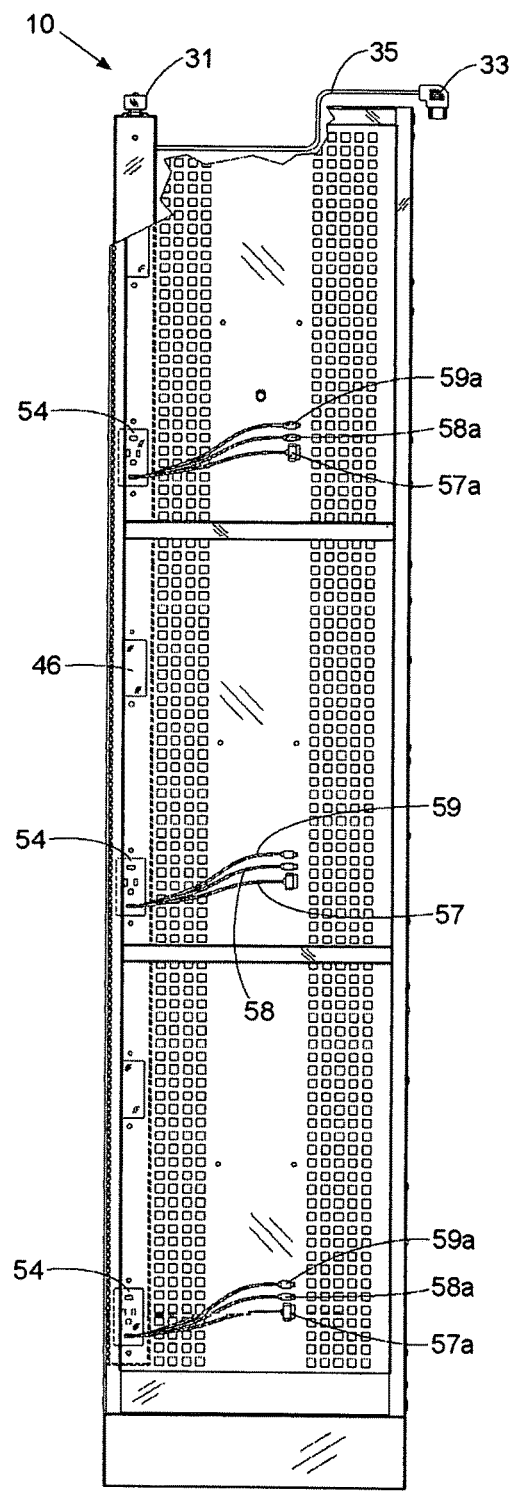
FIG. 6 is a frontal view of the three-tier locker unit, with locker doors cut away so as to show the invention.

The power strip 22 can be secured to the back side of the locker unit in any appropriate and efficient way, preferably using threaded fasteners. This can be, in a preferred embodiment, via machine screws, the power strip 22 being provided with threaded holes 60, at least one and preferably two adjacent to each terminal 54. As shown in FIGS. 3, 5 and 6, the fastener locations in one preferred embodiment are above and below each of the terminals 56. Thus, the power strip is secured to the back side of the locker using machine screws inserted from the forward side of the locker's rear back wall through holes 46a provided therein, to engage with the threaded holes 60 on the power strip.

Preferably an LED 61 is included in the terminal 54 to indicate power status, i.e. the LED is illuminated when the terminal is connected to power.

Figure 5A:
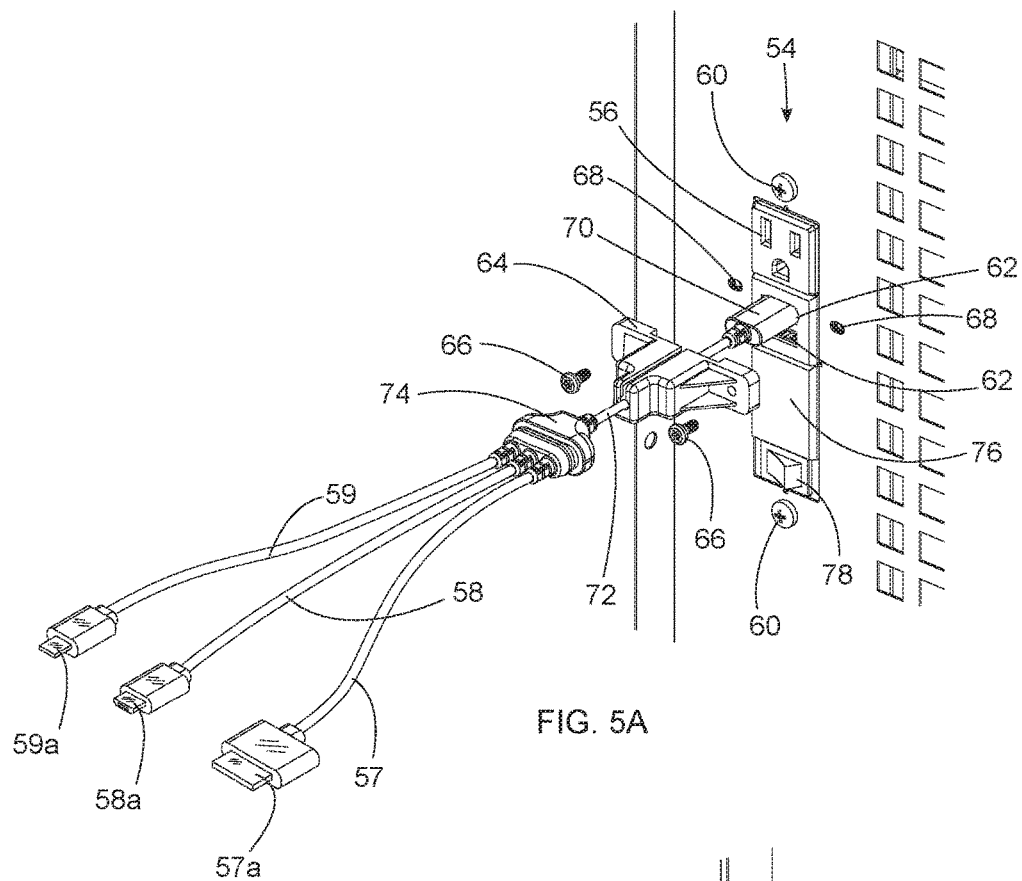
FIGS. 5A and 5B are detail views showing an embodiment of the power strip.
Figure 5B:
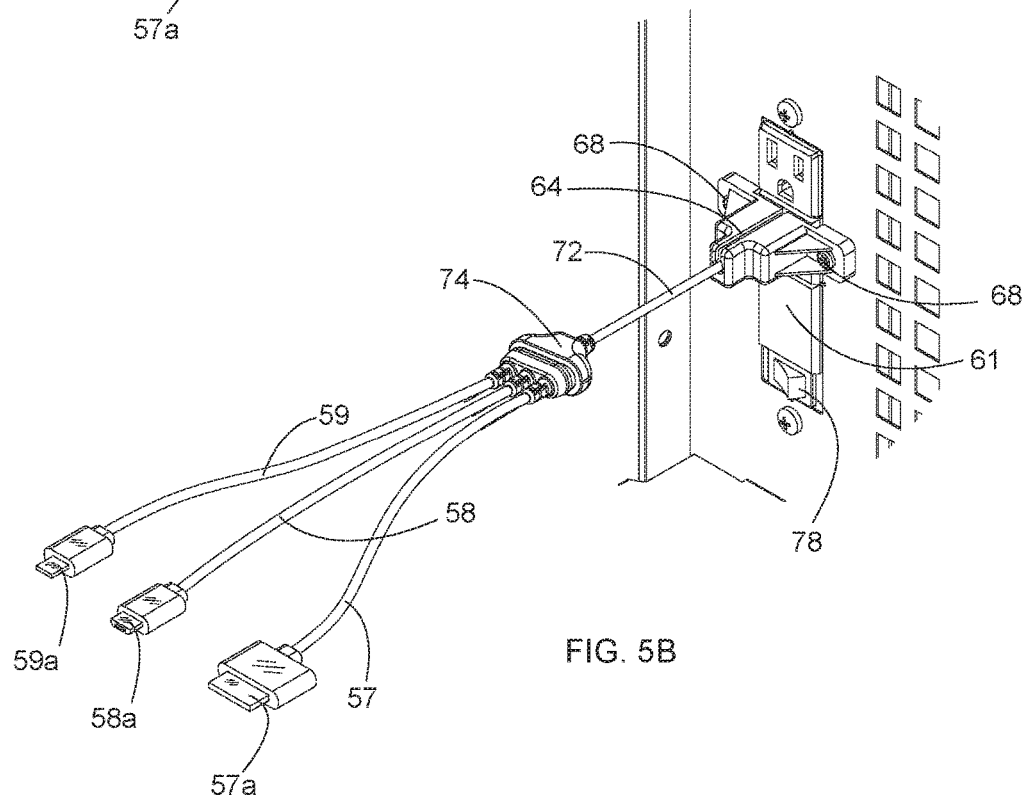

FIGS. 5A and 5B show that the terminal 54, instead of having the charging cables 57-59 fixedly wired into the power strips, can have a USB socket 62 into which a 3-ended charging cable can be plugged. A second USB port or socket 62 can also be provided for receiving a user's own charging cable. A device 64 can be included to retain the 3-ended cable from being removed, secured, e.g., by machine screws 66 that engage in threaded holes 68 in the power strip (accessible through holes in the locker rear panel). In FIG. 5A the USB connector 70 for the cables 57-59 is shown plugged in and the security device 64 positioned to be secured against the terminal 54 and the locker rear panel. In FIG. 5B the device 64 has been affixed in place, retaining the USB plug 70 in the socket. A short cable 72 extends to a small hole lock 74 that connects the USB to each of the cables 57-59. The other USB socket 62 remains uncovered and available. The LED 61 can be replaced with a larger LED light panel 76, which can be illuminated when the charging power is available, or when in use. Alternatively, or in addition, a switch 78 can be included to turn on the LED light 76 when desired (this can be a momentary switch that turns the light on for a limited time).

Another feature of the invention is the modular aspect in that a power strip 22 can easily be connected to a similar power strip on an adjacent multi-tier locker unit that is positioned directly side-by-side against the locker unit 10. FIGS. 4 and 6 show, as discussed above, the line voltage cable 35 that extends from one power strip to the next. The plug 33 is indicated as a shielded plug, and can be plugged into a line-voltage socket 80 of an adjacent power strip. The electrical line 35 preferably is simply a flexible cord.

The above described preferred embodiments are intended to illustrate the principles of the invention, but not to limit its scope. Other embodiments and variations to these preferred embodiments will be apparent to those skilled in the art and may be made without departing from the spirit and scope of the invention as defined in the following claims.

I claim:

1. In a bank of lockers for storage of users' articles, including an integral series of lockers stacked vertically within a locker unit structure having exterior walls common to and continuous through the integral series of lockers and with a series of compartments with doors defining the series of lockers within the exterior walls, and the bank of lockers including a series of said locker unit structures positioned side by side, the improvement comprising:

each locker unit structure including at least one modular charging power strip connected to a rear side of the locker unit structure, having a length that extends vertically to the series of lockers, wherein the modular charging power strip provides charging power for smartphones or other portable electronic devices at said series of lockers within each locker unit structure, the modular charging power strip comprising a linear and elongated housing structure enclosing an electric cord within the housing and having charging terminals at fixed spaced intervals corresponding to spacing between the lockers of the series in each locker unit structure, each charging terminal including a line power socket and a plurality of low-voltage DC power cords extending from the charging terminal with end connectors configured for insertion into at least two different configurations of charging port on the smartphones or other portable electronic devices, the charging terminals being exposed to locker interiors in the series of lockers by alignment of the charging terminals with holes in the rear side of each locker unit structure, each locker unit structure having a series of said holes, one hole for each locker of the series of lockers, and wherein in each locker unit structure the series of said holes are spaced apart equally to said fixed spaced intervals of the charging terminals, each power strip being retained to the rear side of each locker unit structure via fastener holes in the power strip, with machine screws extending from inside each locker of the series of lockers through said rear side and secured into the fastener holes of the power strip, the charging power strip including an external line-voltage plug connected to a cord which extends from said electric cord and a power supply receiving line power and delivering to the charging terminals low-voltage DC power, and the series of side by side locker unit structures being serially connected for line power, each charging power strip having at one end a line-voltage socket and also said cord and line-voltage plug, so that charging power strips obtain power in serial manner from charging power strips at adjacent locker unit structures.

2. The improvement defined in claim 1, wherein each locker unit structure includes a vertical protective channel comprising an elongated channel extending vertically and secured at the rear side of each locker unit structure and within which the charging power strip is positioned.

3. The improvement defined in claim 2, wherein each vertical protective channel comprises an elongated three-sided U-shaped metal channel member forming an elongated vertically extending rectangular enclosure against the rear side of each locker unit structure, one side of the channel member positioned as an extension of a side wall of each locker unit structure.

4. The improvement defined in claim 1, wherein the charging terminal further includes an LED to indicate power status.

5. The improvement defined in claim 1, wherein the charging terminal further includes an LED to provide light illuminating an interior space of each said locker of the series of lockers.

6. The improvement defined in claim 1, wherein the charging terminal further includes a USB port to receive a user's own charging cable.

* * * * *